(12) United States Patent
Yamaguchi

(10) Patent No.: US 8,872,087 B2
(45) Date of Patent: Oct. 28, 2014

(54) IMAGING DEVICE, DRIVING METHOD AND ELECTRONIC APPARATUS WITH ELECTRIC POTENTIAL APPLIED OUTSIDE EXPOSURE PERIOD

(75) Inventor: Tetsuji Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 336 days.

(21) Appl. No.: 13/492,123

(22) Filed: Jun. 8, 2012

(65) Prior Publication Data
US 2012/0318959 A1 Dec. 20, 2012

(30) Foreign Application Priority Data

Jun. 17, 2011 (JP) ................................. 2011-135721

(51) Int. Cl.
H01L 27/00 (2006.01)
H01L 27/146 (2006.01)
H04N 5/378 (2011.01)

(52) U.S. Cl.
CPC .... H01L 27/14632 (2013.01); H01L 27/14665 (2013.01); H01L 27/14627 (2013.01); H04N 5/378 (2013.01)
USPC .............. 250/208.1; 250/214.1; 250/214 DC; 348/294; 348/296; 348/303

(58) Field of Classification Search
USPC ...... 250/214.1, 214 R, 214 DC, 208.1, 208.2; 348/294, 296, 283, 299, 302, 303, 314
See application file for complete search history.

(56) References Cited

U.S. PATENT DOCUMENTS

2004/0211885 A1* 10/2004 Kohno et al. .............. 250/214.1
2010/0007782 A1* 1/2010 Segami et al. ................ 348/311

FOREIGN PATENT DOCUMENTS

JP 2006-278446 10/2006

* cited by examiner

Primary Examiner — Francis M Legasse, Jr.
(74) Attorney, Agent, or Firm — Rader, Fishman & Grauer PLLC

(57) ABSTRACT

Disclosed herein is an imaging device including: a plurality of pixels disposed to form a matrix having pixel rows, the pixels including a pixel electrode formed on a silicon substrate for one of the pixels by being separated away from another pixel electrodes formed for one of the other pixels, a photoelectric conversion film formed on the pixel electrode, and an opposite electrode formed on the photoelectric conversion film; and a driving section configured to apply an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

9 Claims, 13 Drawing Sheets

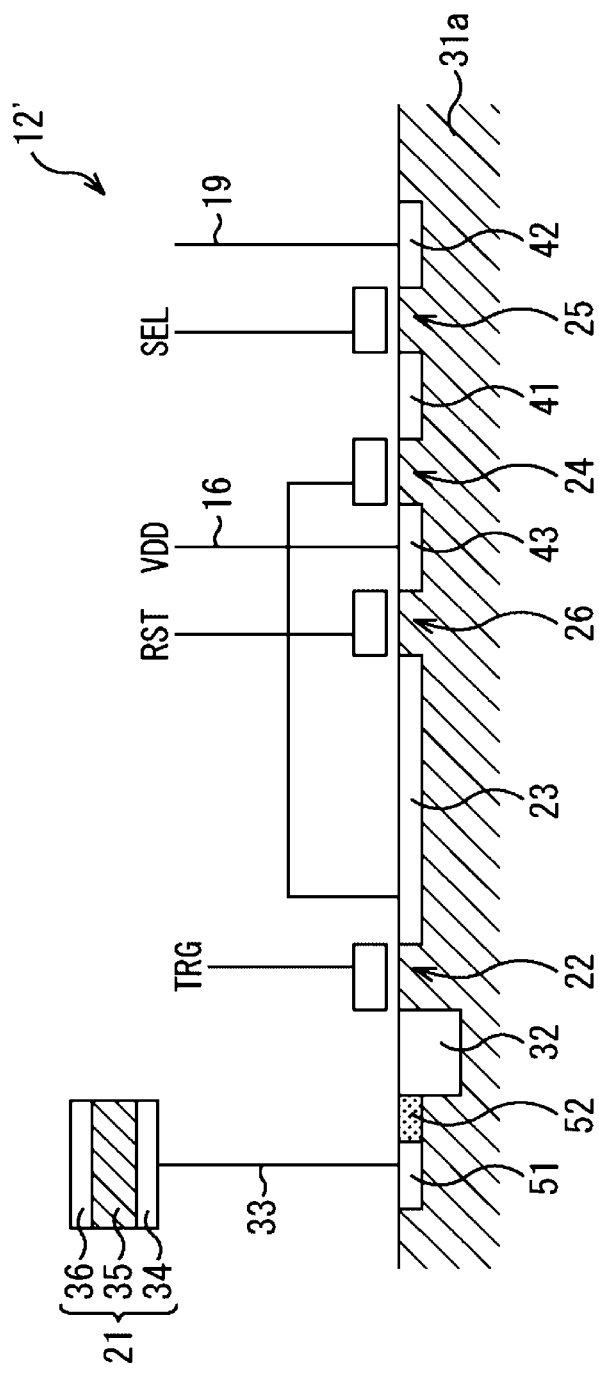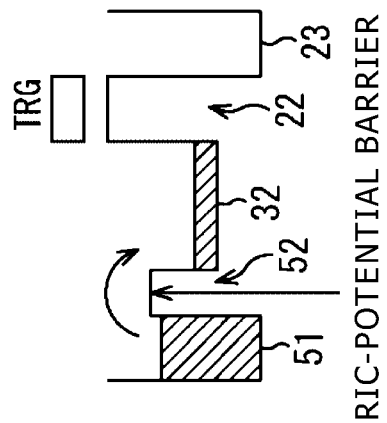
FIG. 5
ELECTRIC-POTENTIAL BARRIER

IMAGING DEVICE, DRIVING METHOD AND ELECTRONIC APPARATUS WITH ELECTRIC POTENTIAL APPLIED OUTSIDE EXPOSURE PERIOD

BACKGROUND

In general, the present disclosure relates to an imaging device, a driving method and an electronic apparatus. More particularly, the present disclosure relates to an imaging device capable of repressing deteriorations of a photoelectric conversion film employed in the device, a driving method for driving the device and an electronic apparatus employing the device.

In a solid-state imaging device such as typically a CCD (Charge Coupled Device) or a CIS (CMOS Image Sensor), the quantity of light incident to a photodiode included in a pixel employed in the device decreases due to miniaturization of the pixel. It is thus difficult to obtain a sufficient sensitivity.

In addition, in the solid-state imaging device, elementary-color filters for the three elementary colors, that is the red, blue and green colors, are widely used. The elementary-color filters are laid out to form the so-called Bayer array which is a checker board design. In the solid-state imaging device employing such color filters, light is inevitably absorbed by the filters. Thus, the efficiency of the utilization of the light decreases and, in addition, a false color may be generated during demosaic processing in some cases.

As is disclosed in documents such as Japanese Patent Laid-open No. 2006-278446, on the other hand, there has been proposed a solid-state imaging device which is configured to employ, for every pixel of the device, a first layer formed on the upper surface of a silicon substrate to serve as a photoelectric conversion section and a second layer formed at a different depth inside the silicon substrate to serve as a photodiode. Inside the silicon substrate, the solid-state imaging device utilizes the fact that the wavelength of absorbed light varies along the depth direction. That is to say, the solid-state imaging device is configured to employ the first layer serving as a photoelectric conversion section configured to carry out a photoelectric conversion process on light having a specific wavelength and the second layer serving as a photodiode for carrying out a photoelectric conversion process on other light having a wavelength different from the specific wavelength.

Thus, the solid-state imaging device disclosed in Japanese Patent Laid-open No. 2006-278446 does not require a color filter so that the solid-state imaging device is capable of avoiding decreases caused by the color filter as decreases of the efficiency of the utilization of light. In addition, since the existing demosaic processing is also no longer necessary, generation of a false color can also be avoided as well.

By the way, the photoelectric conversion section formed on the upper surface of the silicon substrate is configured to include a photoelectric conversion film whose lower and upper surfaces are transparent electrodes sandwiching the film. For example, on the lower surface of the photoelectric conversion film employed in the photoelectric conversion section, pixel electrodes are laid out for their respective pixels, being separated away from each other. On the upper surface of the photoelectric conversion film employed in the photoelectric conversion section, on the other hand, an opposite electrode common to all the pixels is provided, being shared by the pixels. In addition, in the existing solid-state imaging device, the electric potential appearing at the common opposite electrode shared by all the pixels is sustained at a constant level in the course of an operation to drive the pixels. In this state, an electric field having a fixed direction is applied to the photoelectric conversion film sandwiched by the pixel electrodes laid out on the lower surface of the film and the common opposite electrode provided on the upper surface of the film.

SUMMARY

As described above, in the course of an operation to drive the pixels, an electric field having a fixed direction is applied all the time to the photoelectric conversion film formed on the silicon substrate, leading to a phenomenon in which the number of electric-charge traps in the film undesirably increases. Thus, there is raised a problem of reliability deterioration caused by variations in photoelectric conversion characteristic.

It is therefore an aim of the present disclosure addressing the problem described above to provide a capability of repressing deteriorations of the photoelectric conversion film.

An imaging device according to an embodiment of the present disclosure includes:

a plurality of pixels disposed to form a matrix having pixel rows, the pixels including:
 a pixel electrode formed on a silicon substrate for one of the pixels by being separated away from another pixel electrodes formed for one of the other pixels;
 a photoelectric conversion film formed on the pixel electrode; and
 an opposite electrode formed on the photoelectric conversion film; and
a driving section configured to apply an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

A driving method is provided in accordance with the embodiment of the present disclosure to be adopted as a method for driving an imaging device including a plurality of pixels disposed to form a matrix having pixel rows, the pixels including:
 a pixel electrode formed on a silicon substrate for one of the pixels by being separated away from another pixel electrodes formed for one of the other pixels;
 a photoelectric conversion film formed on the pixel electrode; and
 an opposite electrode formed on the photoelectric conversion film.

The driving method has the step of applying an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

An electronic apparatus according to the embodiment of the present disclosure employs an imaging device including:
a plurality of pixels disposed to form a matrix having pixel rows, the pixels including:
 a pixel electrode formed on a silicon substrate for one of the pixels by being separated away from another pixel electrodes formed for one of the other pixels;
 a photoelectric conversion film formed on the pixel electrode; and
 an opposite electrode formed on the photoelectric conversion film; and a driving section configured to apply an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

In accordance with the embodiment of the present disclosure, an operation is carried out to apply an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

In accordance with the embodiment of the present disclosure, it is possible to repress deteriorations of the photoelectric conversion film.

BRIEF DESCRIPTION OF THE DRAWINGS

FIG. 5 is a cross-sectional diagram showing a modified version of the pixel;

DETAILED DESCRIPTION OF THE PREFERRED EMBODIMENTS

Concrete embodiments of the present disclosure are explained in detail by referring to diagrams as follows.

Figure 1:
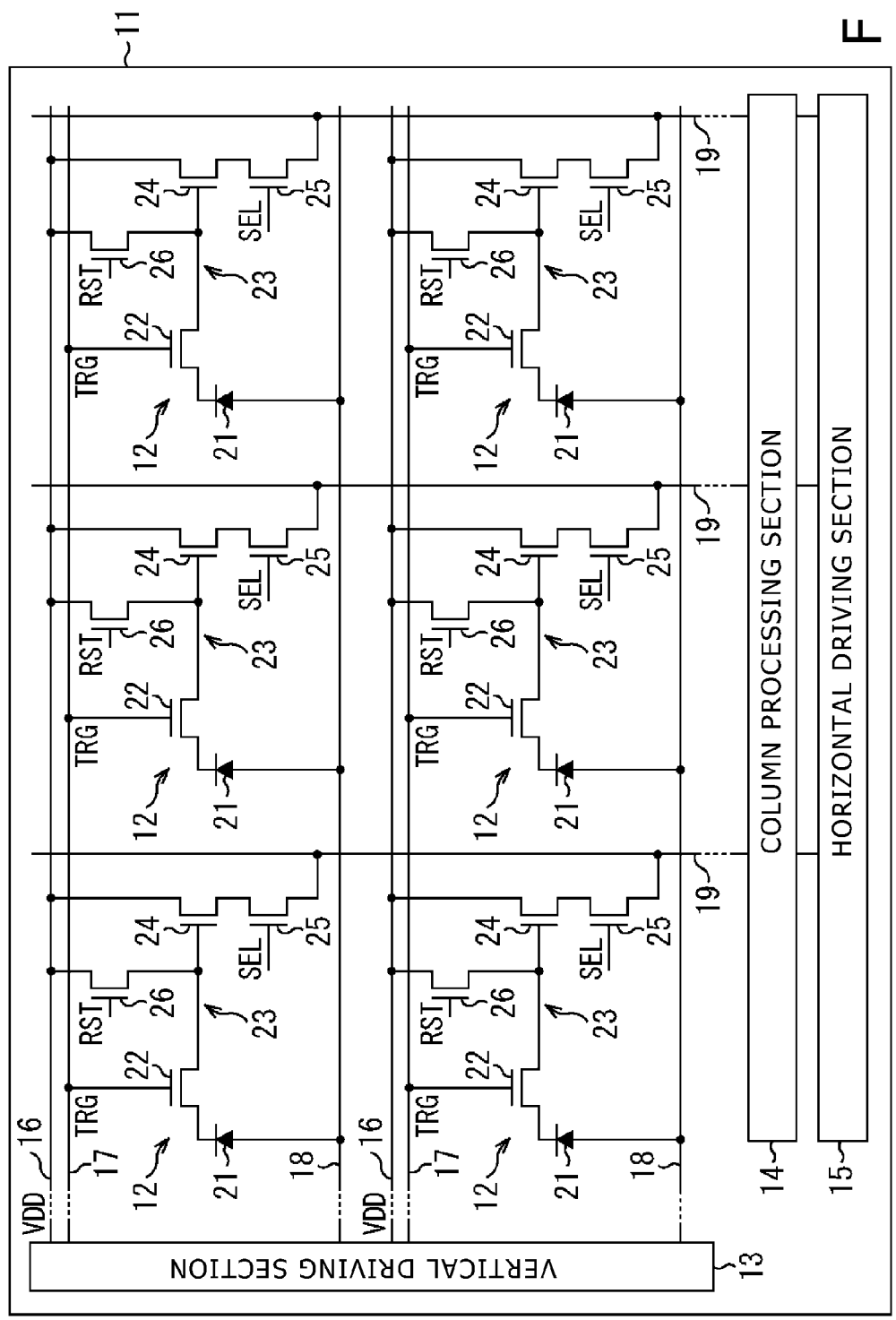
FIG. 1 is a circuit diagram showing a typical configuration of a solid-state imaging device according to a first embodiment of the present disclosure.

FIG. 1 is a circuit diagram showing a typical configuration of a solid-state imaging device 11 according to a first embodiment of the present disclosure.

As shown in FIG. 1, the solid-state imaging device 11 is configured to include a plurality of pixels 12 laid out to form a matrix consisting of pixel rows, a vertical driving section 13, a column processing section 14 and a horizontal driving section 15.

In addition, for every row of pixels 12 in the solid-state imaging device 11, the pixels 12 and the vertical driving section 13 are connected to each other by a power-supply line 16, a horizontal signal line 17 and a facing-electrode power-supply line 18. On top of that, for every column of pixels 12 in the matrix of the solid-state imaging device 11, the pixels 12, the column processing section 14 and the horizontal driving section 15 are connected to each other by a vertical signal line 19.

Each of the pixels 12 is configured to include a photoelectric conversion section 21, a transfer transistor 22, an FD (Floating Diffusion) 23, an amplification transistor 24, a select transistor 25 and a reset transistor 26. It is to be noted that FIG. 1 shows only some of the pixels 12 laid out to form the matrix in the solid-state imaging device 11. To put it concretely, FIG. 1 shows pixels 12 on only two rows and three columns in the matrix.

The vertical driving section 13 supplies a power-supply voltage VDD to the pixels 12 through the power-supply line 16. In addition, the vertical driving section 13 also supplies a transfer signal TRG to the pixels 12 on each of the pixel rows at least having read timings different from each other through the horizontal signal line 17. The transfer signal TRG is a driving signal for driving the transfer transistors 22 each employed in one of the pixels 12 on the pixel row. That is to say, the vertical driving section 13 supplies the transfer signal TRG to the transfer transistor 22 to control operations carried out by the transfer transistor 22. On top of that, the vertical driving section 13 also supplies a select signal SEL for controlling operations carried out by the select transistor 25 through a horizontal signal line not shown in FIG. 1. In addition, the vertical driving section 13 also supplies a reset signal RST for controlling operations carried out by the reset transistor 26 through a horizontal signal line also not shown in FIG. 1. On top of that, the vertical driving section 13 also controls a voltage applied to an opposite electrode through the facing-electrode power-supply line 18. The opposite electrode is an opposite electrode 36 shown in FIG. 2.

The column processing section 14 carries out a CDS (Correlated Double Sampling) operation to extract a signal level from a pixel signal asserted by a pixel 12 on the vertical signal line 19 and outputs the signal level as pixel data for the pixel 12 to the horizontal driving section 15.

With predetermined timings, the horizontal driving section 15 sequentially provides the column processing section 14 with signals for driving the column processing section 14 to output the pixel data to the horizontal driving section 15 and supplies the pixel data received from the column processing section 14 to an image processing circuit not shown in FIG. 1.

The photoelectric conversion section 21 is a photodiode for generating electric charge with an amount corresponding to the quantity of light incident to the photoelectric conversion section 21. The anode of the photodiode is connected to the facing-electrode power-supply line 18 whereas the cathode of the photodiode is connected to the transfer transistor 22.

The transfer transistor 22 transfers electric charge generated in the photoelectric conversion section 21 to the FD 23 in accordance with the transfer signal TRG supplied to the transfer transistor 22 through the horizontal signal line 17. The FD 23 is an electric-charge accumulation area for accumulating electric charge transferred to the FD 23 by the transfer transistor 22. An electric potential according to the amount of the electric charge accumulated in the FD 23 is supplied to the gate electrode of the amplification transistor 24. The amplification transistor 24 converts the electric potential representing the amount of the electric charge accumulated in the FD 23 into a pixel signal having a voltage according to the amount of the electric charge and outputs the pixel signal to the vertical signal line 19 by way of the select transistor 25.

As described above, the select transistor 25 asserts the pixel signal, which is received from the amplification transistor 24, on the vertical signal line 19 in accordance with the select signal SEL supplied to the select transistor 25 through a horizontal signal line not shown in FIG. 1. In accordance with the reset signal RST supplied to the reset transistor 26 through a horizontal signal line also not shown in this figure, the reset transistor 26 discharges electric charge accumulated in the FD 23 from the FD 23 to the power-supply line 16 in order to reset the FD 23.

Figure 2:
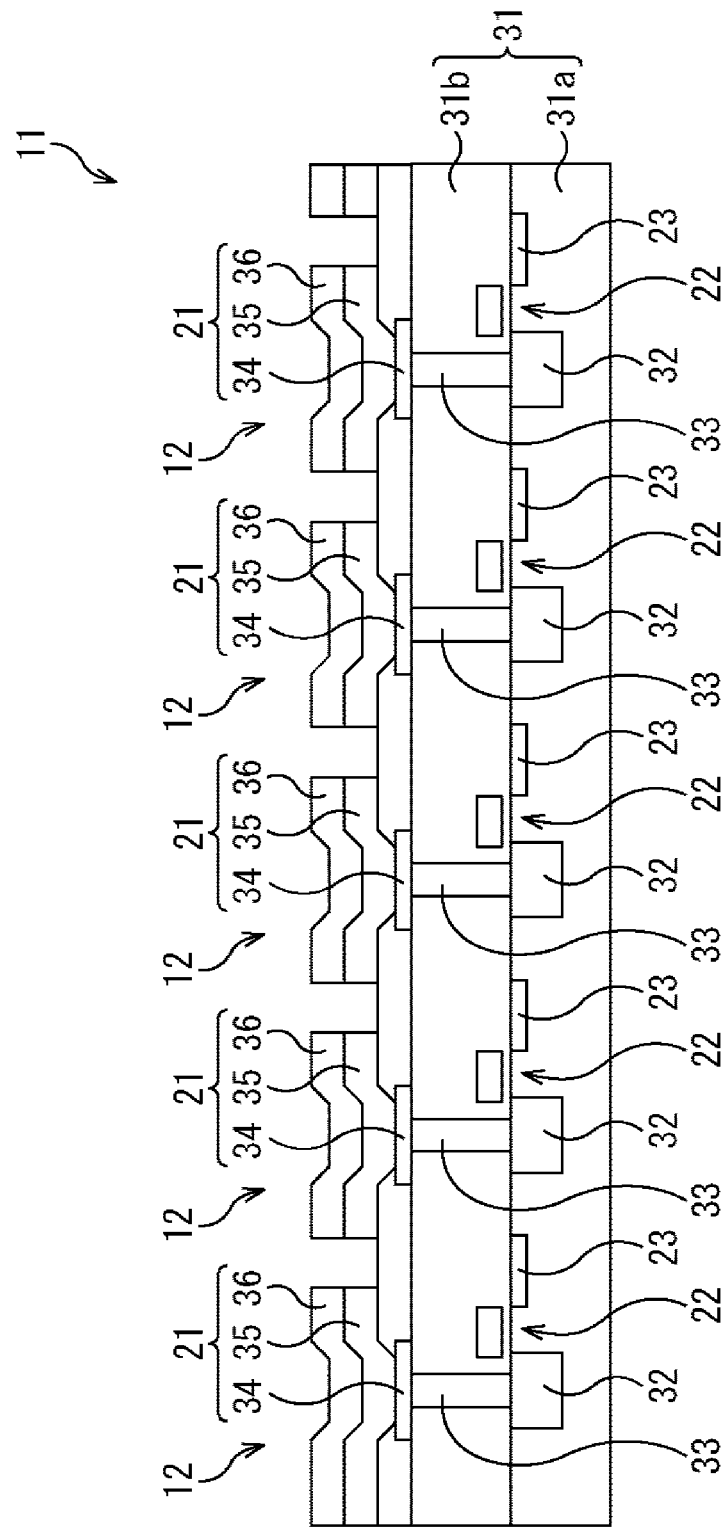
FIG. 2 is a cross-sectional diagram showing a typical configuration of the solid-state imaging device.

FIG. 2 is a diagram showing a vertical-direction cross-sectional structure of a pixel array portion included in the solid-state imaging device 11 shown in FIG. 1. The vertical-direction cross-sectional structure is a cross-sectional structure along the vertical signal line 19. FIG. 2 shows a typical configuration of the solid-state imaging device 11 adopting the configuration of a laminated CMOS (Complementary Metal Oxide Semiconductor) image sensor.

As shown in FIG. 2, the solid-state imaging device 11 is formed on a silicon substrate 31 which includes a silicon layer 31a and an oxide film 31b. Imaging light is radiated to a surface facing the upper side in FIG. 2. In the following description, the surface facing the upper side in FIG. 2 is referred to simply as an upper surface.

For every pixel 12 in the solid-state imaging device 11, an FD 23 and an electric-charge accumulation area 32 are embedded on the upper-surface side of the silicon layer 31a whereas a transfer transistor 22 is formed between the FD 23 and the electric-charge accumulation area 32. In addition, for every pixel 12 in the solid-state imaging device 11, a connection section 33 is formed to penetrate the oxide film 31b. On top of that, for every pixel 12 in the solid-state imaging device 11, on the upper surface of the oxide film 31b, a pixel electrode 34, a photoelectric conversion film 35 and an opposite electrode 36 are sequentially formed in the same order as the order in which the pixel electrode 34, the photoelectric conversion film 35 and the opposite electrode 36 are enumerated in this sentence in order to form a photoelectric conversion section 21 having a laminated structure.

The electric-charge accumulation area 32 is connected to the pixel electrode 34 through the connection section 33. That is to say, the connection section 33 connects the electric-charge accumulation area 32 to the pixel electrode 34. The electric-charge accumulation area 32 is used for accumulating electric charge generated in the photoelectric conversion film 35.

The pixel electrode 34 is formed on the silicon substrate 31 and used as an electrode for connecting the photoelectric conversion film 35 to the connection section 33. The photoelectric conversion film 35 is formed on the pixel electrode 34 and used for converting light incident to the photoelectric conversion film 35 into electric charge. The opposite electrode 36 is formed on the photoelectric conversion film 35 and receives a predetermined voltage from the vertical driving section 13 through the facing-electrode power-supply line 18 shown in FIG. 1.

In the solid-state imaging device 11, the vertical driving section 13 controls the operation to read out the pixel signals from the pixels 12 for every pixel row whereas an opposite electrode 36 is formed for each of pixels 12 in such a way that the opposite electrodes 36 each formed for one of the pixels 12 at least having different read timings are separated away from each other. That is to say, as shown in FIG. 2, an opposite electrode 36 formed for any specific row of pixels 12 is separated away from an opposite electrode 36 formed for any other row of pixels 12.

Figure 3:
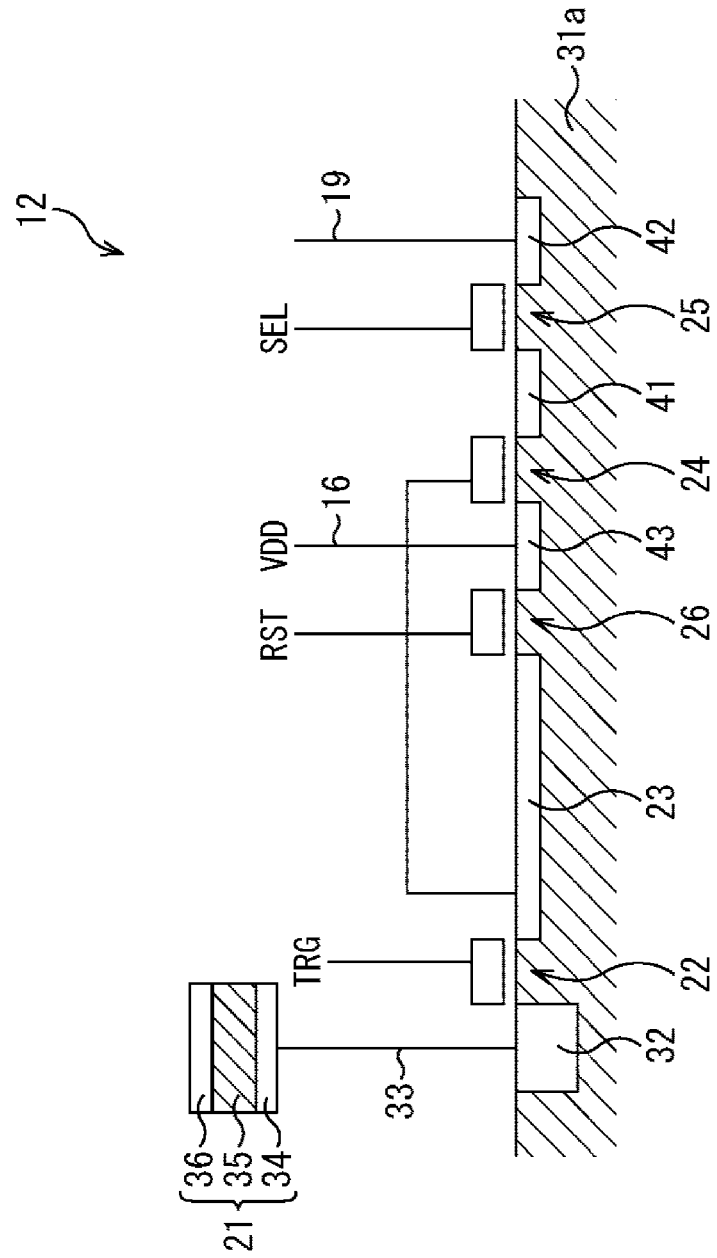
FIG. 3 is a cross-sectional diagram showing a typical configuration of a pixel.

FIG. 3 is a cross-sectional diagram showing a typical configuration of the pixel 12.

As shown in FIG. 3, in the pixel 12, the FD 23, the electric-charge accumulation area 32 and diffusion layers 41 to 43 are embedded on the upper-surface side of the silicon layer 31a. In addition, in the pixel 12, the photoelectric conversion section 21 is connected to the electric-charge accumulation area 32 through the connection section 33 whereas the transfer transistor 22 is formed at a location between the electric-charge accumulation area 32 and the FD 23.

On top of that, in the pixel 12, the reset transistor 26 is formed between the FD 23 and the diffusion layer 43, the amplification transistor 24 is formed between the diffusion layer 43 and the diffusion layer 41 whereas the select transistor 25 is formed between the diffusion layer 41 and the diffusion layer 42. In addition, the power-supply line 16 is connected to the diffusion layer 43 whereas the vertical signal line 19 is connected to the diffusion layer 42.

Next, a method for driving the pixel 12 having such a configuration is explained by referring to FIG. 4 as follows.

Figure 4:
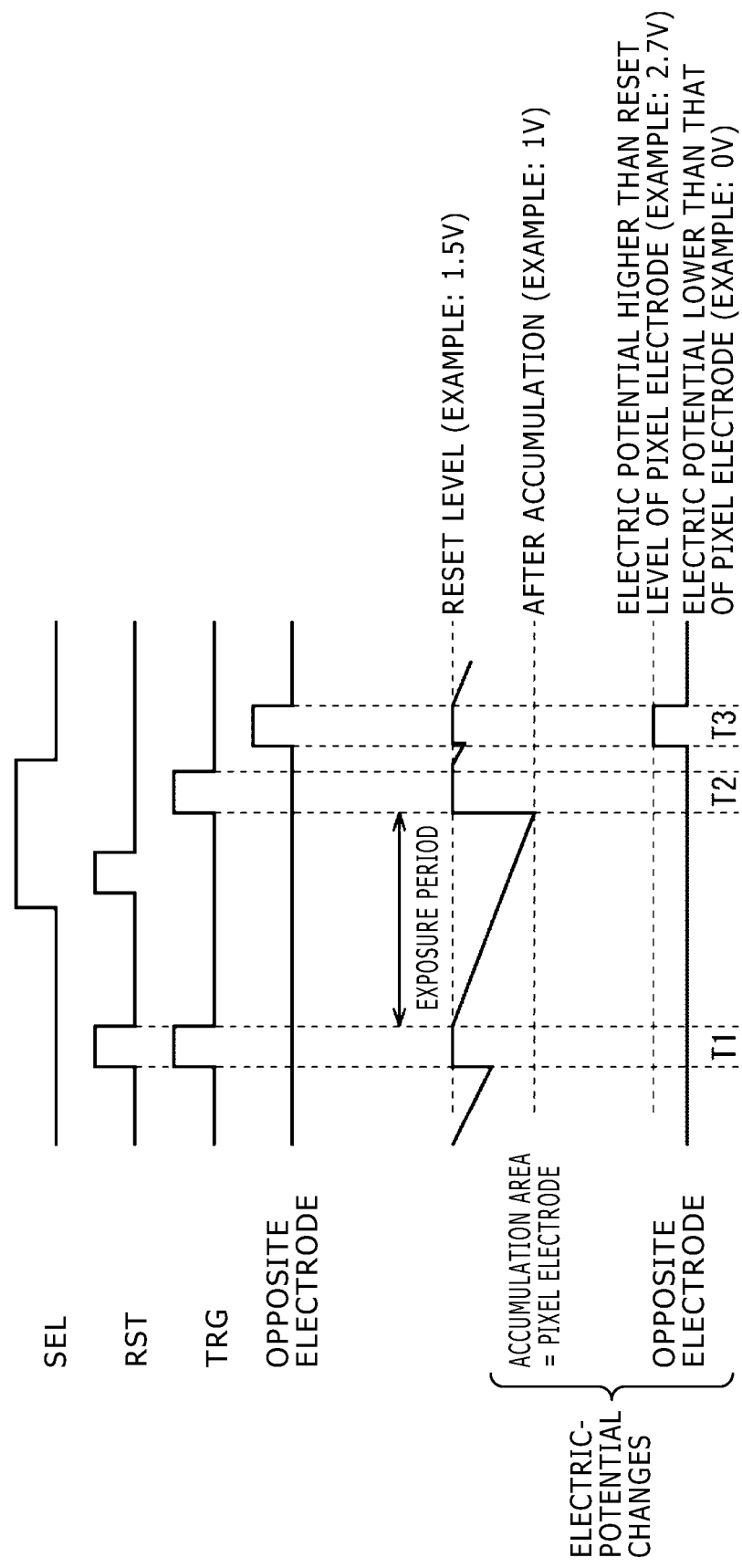
FIG. 4 is an explanatory diagram to be referred to in description of a method for driving the solid-state imaging device.

FIG. 4 shows timings for driving the pixel 12 as well as electric-potential changes of the pixel electrode 34 and opposite electrode 36 which sandwich the photoelectric conversion film 35. It is to be noted that, since the electric-charge accumulation area 32 is connected to the pixel electrode 34 through the connection section 33, the electric-charge accumulation area 32 is set at an electric potential of the same level as the electric potential appearing at the pixel electrode 34. In addition, even though electrons are used in the following description as a photoelectric conversion signal, holes can also be used as the photoelectric conversion signal. In the case of holes used as a photoelectric conversion signal, however, the polarity of every electric potential needs to be inverted in the following description.

On top of that, as described above, the vertical driving section 13 controls a voltage applied to the opposite electrode 36 through the facing-electrode power-supply line 18. At a normal time, that is, during a period other than a timing T3 to be described later, the connection section 33 sustains the voltage applied to the opposite electrode 36 at an electric potential lower than an electric potential appearing at the pixel electrode 34 (for example, 0 V).

First of all, with a timing T1, the vertical driving section 13 puts the transfer signal TRG and the reset signal RST in an ON state in order to reset the electric-charge accumulation area 32 at the power-supply voltage VDD, which is appearing on the power-supply line 16, through the FD 23. To put it in detail, the vertical driving section 13 puts the transfer signal TRG and the reset signal RST in the ON state in order to turn on the transfer transistor 22 and the reset transistor 26 respectively. With the reset transistor 26 turned on, electric charge accumulated in the electric-charge accumulation area 32 by turning on the transfer transistor 22 is electrically discharged to the power-supply line 16 by way of the FD 23. At that time, the reset level of the electric-charge accumulation area 32 varies in accordance with the potential design. It is to be noted, however, that the reset level of the electric-charge accumulation area 32 is typically 1.5 V.

Then, at the end of the timing T1, the vertical driving section 13 puts the transfer signal TRG and the reset signal RST in an OFF state. When the vertical driving section 13 puts the transfer signal TRG and the reset signal RST in the OFF state, the exposure period of the photoelectric conversion section 21 is started. During the exposure period of the photoelectric conversion section 21, electric charge generated in the photoelectric conversion film 35 is accumulated in the electric-charge accumulation area 32 so that an electric potential appearing at the electric-charge accumulation area 32 decreases. At the end of the exposure period of the photoelectric conversion section 21, the electric potential appearing at the electric-charge accumulation area 32 attains a typical level of 1 V.

In addition, the vertical driving section 13 puts the select signal SEL in an ON state at a time during the exposure period of the photoelectric conversion section 21. Then, with the select signal SEL put in the ON state, the vertical driving section 13 puts the reset signal RST in an ON state in order to read out an electric potential appearing at the FD 23 in a reset state. Later on, with a timing T2, the vertical driving section 13 puts the transfer signal TRG in an ON state in order to terminate the exposure period and transfer electric charge accumulated in the electric-charge accumulation area 32 to the FD 23. Thus, an electric potential appearing at the FD 23 in accordance with the electric charge accumulated during the exposure period can be read out since the select signal SEL is still sustained in the ON state. In addition, since the electric charge accumulated in the electric-charge accumulation area 32 is transferred to the FD 23, an electric potential appearing in the electric-charge accumulation area 32 again attains the reset level.

Then, with the timing T3 right after the end of the timing T2, the vertical driving section 13 applies an electric potential higher than the reset level of the pixel electrode 34 to the opposite electrode 36 through the facing-electrode power-supply line 18. The electric potential higher than the reset level of the pixel electrode 34 is typically 2.7 V.

Thus, an electric potential is applied to the photoelectric conversion film 35 in a direction opposite to the direction of a voltage applied to the photoelectric conversion film 35 during the exposure period. As a result, it is possible to get rid of (or to eliminate) electric-charge traps generated in the photoelectric conversion film 35 by the voltage applied during the exposure period. That is to say, in the existing solid-state imaging device, an electric field is applied to the photoelectric conversion film in the same direction all the time, increasing the number of electric-charge traps generated in the photoelectric conversion film, so that the characteristic deterioration process is accelerated. On the other hand, the solid-state imaging device 11 is capable of preventing electric-charge traps from being accumulated in the photoelectric conversion film 35.

As described above, the solid-state imaging device 11 is capable of preventing electric-charge traps from being accumulated in the photoelectric conversion film 35. Thus, it is possible to repress deteriorations caused by the electric-charge traps which would otherwise be accumulated in the photoelectric conversion film 35 as is the case with the existing solid-state imaging device.

In addition, in the solid-state imaging device 11, with the timing T3 right after the end of the timing T2, the vertical driving section 13 applies an electric potential to the photoelectric conversion film 35 in a direction opposite to the direction of a voltage applied to the photoelectric conversion film 35 during the exposure period. Thus, the voltage applied with the timing T3 is approximately uniform for a plurality of pixels 12 employed in the solid-state imaging device 11. That is to say, by providing the timing T3 right after the end of the timing T2, it is possible to prevent variations from being generated in the voltage serving as a reversed bias for every plurality of pixels 12 employed in the solid-state imaging device 11.

For example, with the timing T3 after the end of the timing T2, the vertical driving section 13 applies an electric potential to the photoelectric conversion film 35 in a direction opposite to the direction of a voltage applied to the photoelectric conversion film 35 during the exposure period. Also in this case, the solid-state imaging device 11 is capable of preventing electric-charge traps from being accumulated in the photoelectric conversion film 35 even if the timing T3 is provided at a point of time separated away from the timing T2. If the timing T3 is provided at a point of time separated away from the timing T2, however, the amount of electric charge accumulated in the photoelectric conversion film 35 varies from pixel 12 to pixel 12 due to a photoelectric conversion process carried out after the end of the timing T2. Thus, since variations are generated in the voltage serving as a reversed bias, the extent to which electric-charge traps are eliminated from the photoelectric conversion film 35 also varies from pixel 12 to pixel 12. As a result, the characteristic also varies from pixel 12 to pixel 12 as well.

In the solid-state imaging device 11, on the other hand, no variations are generated in the voltage serving as a reversed bias so that electric-charge traps can be eliminated from every pixel 12 uniformly. It is thus possible to prevent the characteristic from varying from pixel 12 to pixel 12. It is needless to say that, with regard to the operation to get rid of electric-charge traps, the timing T3 does not have to be a timing immediately following the timing T2. As described before, the timing T3 is a timing with which the vertical driving section 13 applies an electric potential to the photoelectric conversion film 35 in a direction opposite to the direction of a voltage applied to the photoelectric conversion film 35 during the exposure period.

It is to be noted that, in the case of a laminated image sensor having a configuration in which the photoelectric conversion film 35 is formed on the silicon substrate 31, after a process of forming wires, a process of forming the photoelectric conversion film 35 is carried out. Thus, due to a restriction imposed on the temperature of the process of forming the photoelectric conversion film 35, an amorphous semiconductor formed at a low temperature, a poly-crystal semiconductor, an organic film or the like can be used as a material for making the photoelectric conversion film 35. Since the photoelectric conversion film 35 made of such a material has a number of defects inside the photoelectric conversion film 35, the characteristic may change with ease due to an electric-charge trap during an operation. Thus, the reliability may deteriorate in some cases.

Therefore, in the solid-state imaging device 11 employing the photoelectric conversion film 35 made of such a material, the pixel 12 is driven by adoption of the method explained earlier by referring to FIG. 4 in order to produce a more effective effect. That is to say, it is extremely advantageous to exhaust electric-charge traps from the inside of the photoelectric conversion film 35 in which deteriorations are generated with ease by the electric-charge traps in order to repress the deteriorations.

It is to be noted that, in accordance with this driving method, with the transfer transistor 22 turned off, that is, with the pixel electrode 34 put in a floating state, the vertical driving section 13 applies an electric potential to the photoelectric conversion film 35 in a direction opposite to the direction of a voltage applied to the photoelectric conversion film 35 during the exposure period in order to effectively extract electric charge trapped inside the photoelectric conversion film 35.

FIG. 5 is a cross-sectional diagram showing a modified version of the pixel 12.

A pixel 12' shown in FIG. 5 is identical with the pixel 12 shown in FIG. 3 in that the pixel 12' is also configured to include the photoelectric conversion section 21, the transfer transistor 22, the FD 23, the amplification transistor 24, the select transistor 25, the reset transistor 26, the electric-charge accumulation area 32, the connection section 33 and the diffusion areas 41 to 43. Therefore, detailed explanations of the photoelectric conversion section 21, the transfer transistor 22, the FD 23, the amplification transistor 24, the select transistor 25, the reset transistor 26, the electric-charge accumulation area 32, the connection section 33 and the diffusion areas 41 to 43 are eliminated.

However, the configuration of the pixel 12' shown in FIG. 5 is different from the configuration of the pixel 12 shown in FIG. 3 in that the pixel 12' also has a contact area 51 and an electric-potential barrier section 52 and, in addition, the photoelectric conversion section 21 is connected to the contact area 51 through the connection section 33.

The contact area 51 is typically an area having an n-type impurity concentration higher than that of the electric-charge accumulation area 32. For example, the electric-charge accumulation area 32 is an N− area whereas the contact area 51 is an N+ area. On the other hand, the electric-potential barrier section 52 is typically an area having an n-type impurity concentration lower than that of the electric-charge accumulation area 32. For example, the electric-potential barrier section 52 is an N− − area.

Thus, as shown in a potential diagram given on the lower side of FIG. 5, the electric-potential barrier section 52 generates an electric-potential barrier having a predetermined electric potential at a position between the contact area 51 and the electric-charge accumulation area 32. As shown in the potential diagram, the predetermined electric potential is higher than electric potentials appearing at the contact area 51 and the electric-charge accumulation area 32. Thus, some of electric charge transferred from the photoelectric conversion section 21 to the contact area 51 by way of the connection section 33 and accumulated in the contact area 51 surmounts the electric-potential barrier formed by the electric-potential barrier section 52 and leaks from the contact area 51 to the electric-charge accumulation area 32.

By providing the pixel 12' with the electric-potential barrier section 52 at a position between the contact area 51 and the electric-charge accumulation area 32 as described above, the contact area 51 is configured to typically sustain a fixed electric potential determined by the electric-potential barrier section 52. Then, some electric charge surmounting the electric-potential barrier generated by the electric-potential barrier section 52 is accumulated in the electric-charge accumulation area 32 and read out later as a pixel signal.

Next, a first driving method for driving the pixel 12' is explained by referring to FIG. 6 as follows.

Figure 6:
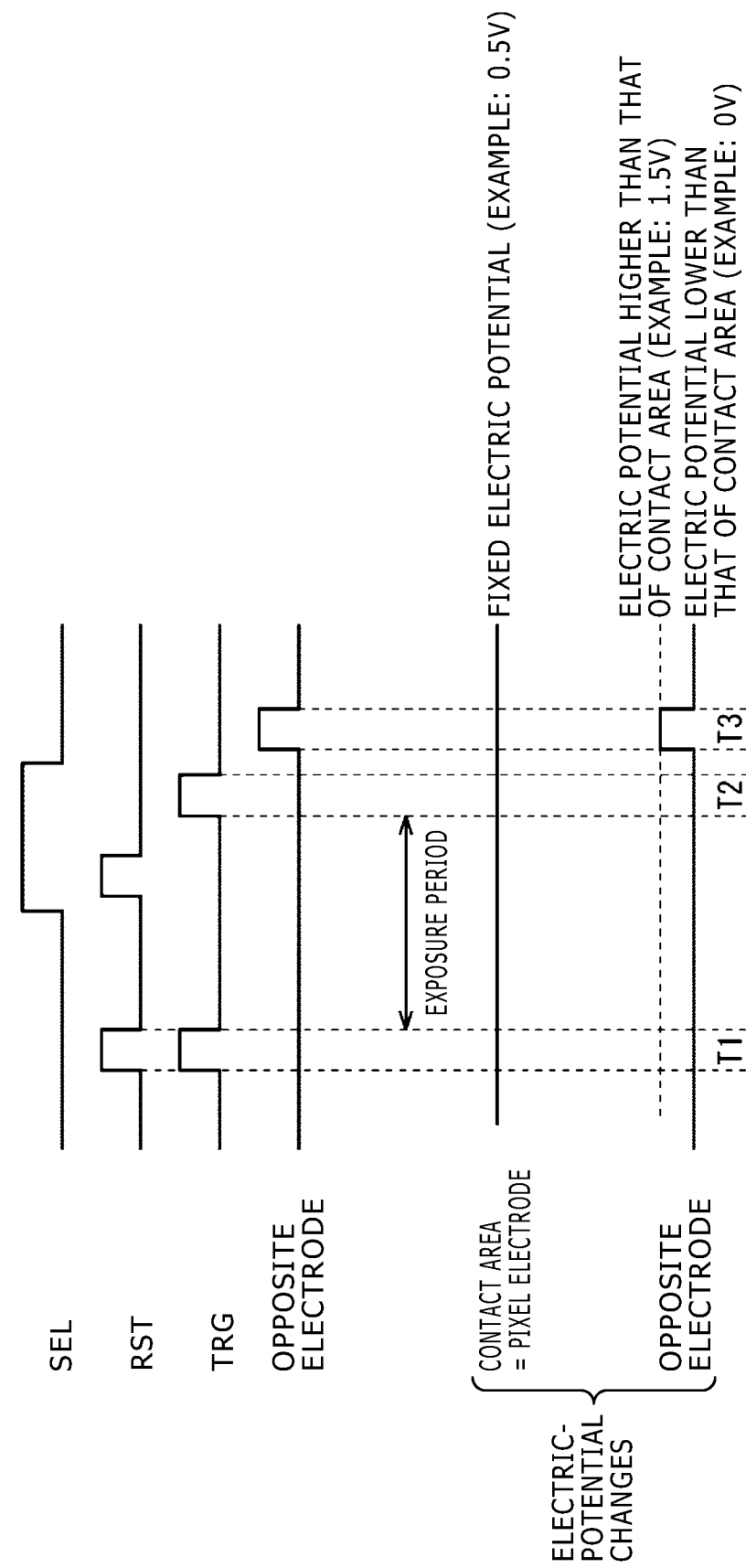
FIG. 6 is an explanatory diagram to be referred to in description of a first method for driving the solid-state imaging device.

FIG. 6 is a diagram showing driving timings of the pixel 12' as well as electric-potential changes of the pixel electrode 34 and the opposite electrode 36 which sandwich the photoelectric conversion film 35.

In this pixel 12', since the pixel electrode 34 is connected to the contact area 51 through the connection section 33, the level of an electric potential appearing at the pixel electrode 34 is the same as the level of an electric potential appearing at the contact area 51. In addition, since the electric potential appearing at the contact area 51 is typically sustained at a fixed level determined by the electric-potential barrier section 52, the electric potential appearing at the pixel electrode 34 is also sustained at the fixed level such as 0.5 V. On top of that, at normal times, an electric potential lower than that of the contact area 51 is applied to the opposite electrode 36. A typical example of the electric potential lower than that of the contact area 51 is an electric potential of 0 V.

First of all, much like the driving timings shown in FIG. 4, with a timing T1, the vertical driving section 13 puts the transfer signal TRG and the reset signal RST in an ON state in order to reset the electric-charge accumulation area 32 at the power-supply voltage VDD, which is appearing on the power-supply line 16, through the FD 23. Since an electric-potential barrier formed by the electric-potential barrier section 52 exists at a position between the electric-charge accumulation area 32 and the contact area 51, unlike the electric-potential changes shown in FIG. 4, the electric potential appearing at the contact area 51 is sustained at a constant level at that time.

Then, at the end of the timing T1, the vertical driving section 13 puts the transfer signal TRG and the reset signal RST in an OFF state. When the vertical driving section 13 puts the transfer signal TRG and the reset signal RST in the OFF state, the exposure period of the photoelectric conversion section 21 is started. During the exposure period of the photoelectric conversion section 21, electric charge generated in the photoelectric conversion film 35 is supplied to the contact area 51 by way of the connection section 33. However, the electric charge surmounts the electric-potential barrier formed by the electric-potential barrier section 52 and is accumulated in the electric-charge accumulation area 32.

Later on, much like the driving timings shown in FIG. 4, an electric potential appearing at the FD 23 put in a reset state is read out. Then, the exposure period is terminated with a timing T2. At the end of the exposure period, the electric charge accumulated in the electric-charge accumulation area 32 is transferred to the FD 23.

Then, with the timing T3 right after the end of the timing T2, the vertical driving section 13 applies an electric potential higher than that of the contact area 51 to the opposite electrode 36 through the facing-electrode power-supply line 18. The electric potential higher than that appearing on the pixel electrode 34 is typically 1.5 V. Thus, in the pixel 12', an electric potential is applied to the photoelectric conversion film 35 in a direction opposite to the direction of a voltage applied to the photoelectric conversion film 35 during the exposure period. As a result, it is possible to get rid of electric-charge traps generated in the photoelectric conversion film 35 by the voltage applied during the exposure period. Accordingly, the solid-state imaging device 11 is capable of preventing electric-charge traps from being accumulated in the photoelectric conversion film 35. Therefore, it is possible to prevent the photoelectric conversion film 35 from deteriorating due to electric-charge traps accumulated in the photoelectric conversion film 35.

In addition, the electric potential appearing at the contact area 51 is sustained at a fixed level in the pixel 12'. Thus, when an electric potential is applied to the photoelectric conversion film 35 with the timing T3 in a direction opposite to the direction of a voltage applied to the photoelectric conversion film 35 during the exposure period, the electric-potential difference is approximately uniform in all the pixels 12' employed in the solid-state imaging device 11. Accordingly, the extent to which electric-charge traps can be eliminated from the photoelectric conversion film 35 is also uniform as well in all the pixels 12' employed in the solid-state imaging device 11. As a result, it is possible to prevent the characteristic of the solid-state imaging device 11 from varying from pixel 12' to pixel 12'.

Figure 7:
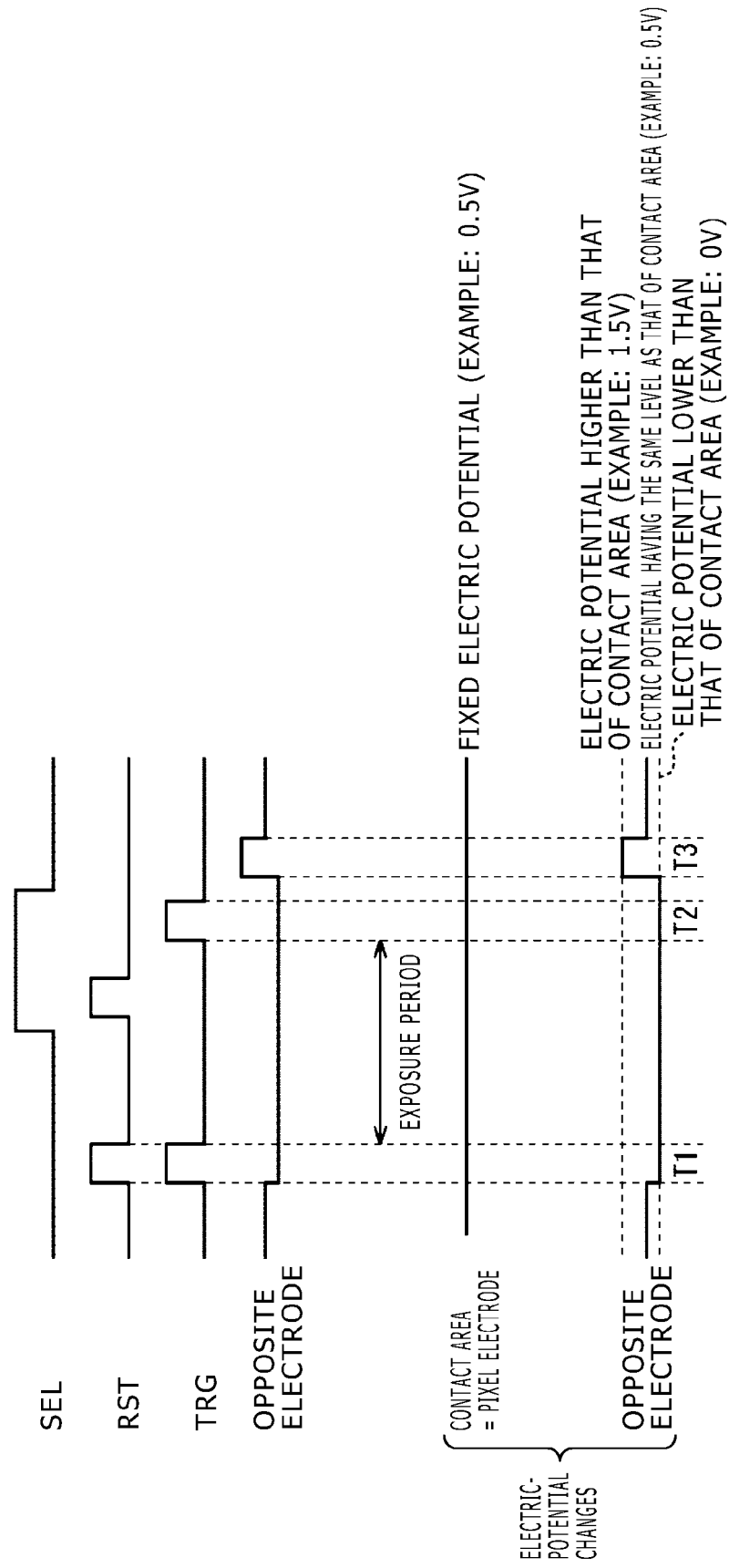
FIG. 7 is an explanatory diagram to be referred to in description of a second method for driving the solid-state imaging device.

Next, a second driving method for driving the pixel 12' is explained by referring to FIG. 7 as follows.

The second driving method for driving the pixel 12' is the same as the driving method explained above by referring to FIG. 6 as the first driving method for driving the pixel 12' in that, in accordance with the second driving method, during the exposure period, an electric potential lower than that appearing in the contact area 51 is applied to the opposite electrode 36 whereas, with the timing T3, an electric potential higher than that appearing in the contact area 51 is applied to the opposite electrode 36. For example, during the exposure period, an electric potential of typically 0 V is applied to the opposite electrode 36 whereas, with the timing T3, an electric potential of typically 1.5 V is applied to the opposite electrode 36.

However, the second driving method for driving the pixel 12' is different from the first driving method for driving the pixel 12' in that, in accordance with the second driving method, before the start of the exposure period and after the end of the timing T3, an electric potential having the same level as that appearing in the contact area 51 is applied to the opposite electrode 36. For example, before the start of the exposure period and after the end of the timing T3, an electric potential of typically 0.5 V is applied to the opposite electrode 36.

As described above, in accordance with the second driving method for driving the pixel 12', during the periods in which the electric potentials appearing at the contact area 51 and the opposite electrode 36 have the same level, the photoelectric conversion film 35 is sustained in a state of no electric-potential difference. Thus, a period in which a voltage is applied to the photoelectric conversion film 35 becomes shorter than that of the first driving method described above. As a result, in comparison with a configuration having a long period in which a voltage is applied to the photoelectric conversion film 35, it is possible to repress deteriorations of the photoelectric conversion film 35. It is to be noted that, in this period, the electric potentials appearing at the contact area 51 and the opposite electrode 36 are not required to have exactly the same level. That is to say, in this period, the electric potentials appearing at the contact area 51 and the opposite electrode 36 can also be set at about the same level in order to obtain the same effect.

Figure 8:
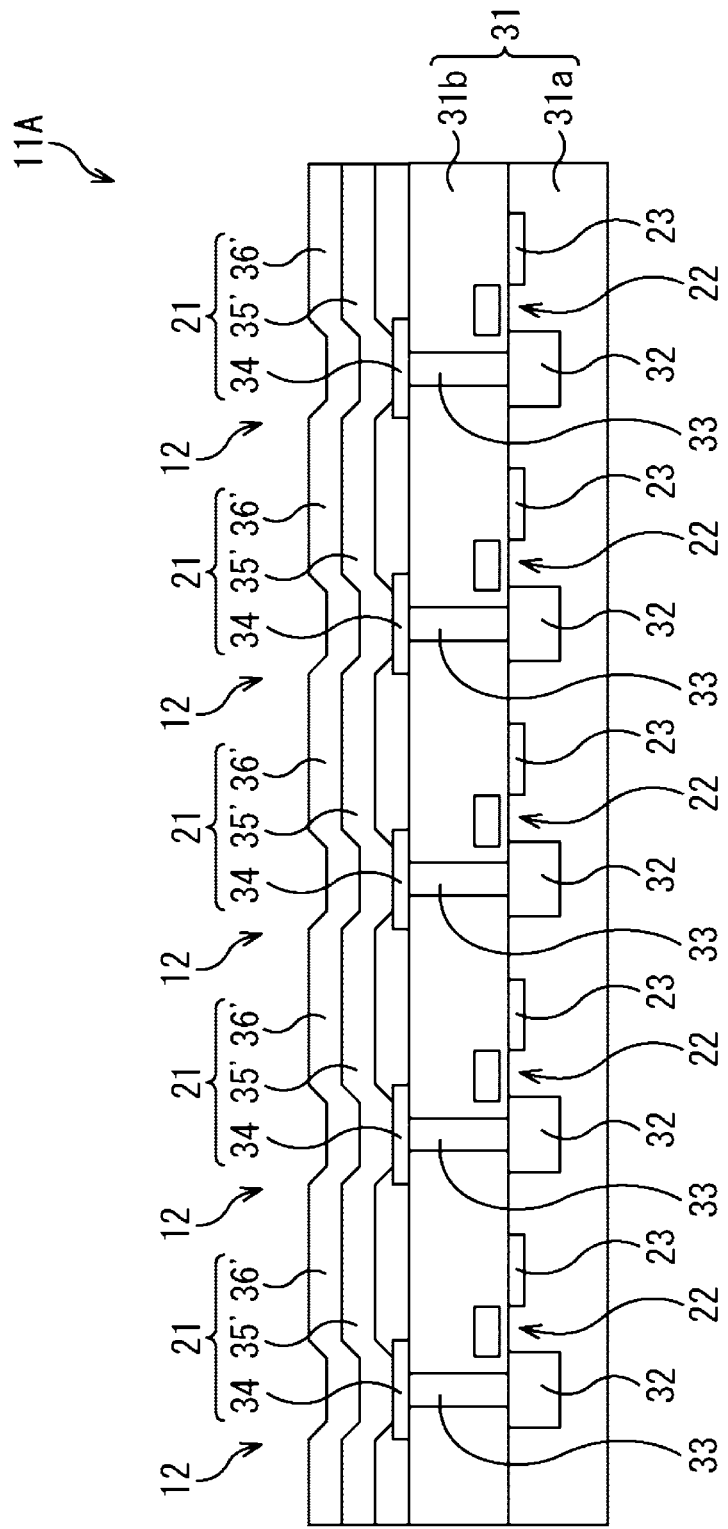
FIG. 8 is a cross-sectional diagram showing a typical configuration of a solid-state imaging device according to a second embodiment of the present disclosure.

FIG. 8 is a diagram showing a typical vertical-direction cross-sectional structure of a pixel array portion included in the solid-state imaging device 11A according to a second embodiment of the present disclosure.

The solid-state imaging device 11A shown in FIG. 8 is identical with the solid-state imaging device 11 shown in FIG. 2 in that the solid-state imaging device 11A is also configured to include the transfer transistor 22, the FD 23, the electric-charge accumulation area 32, the connection section 33 and the pixel electrode 34. Therefore, detailed explanations of the transfer transistor 22, the FD 23, the electric-charge accumulation area 32, the connection section 33 and the pixel electrode 34 are eliminated.

However, the solid-state imaging device 11A shown in FIG. 8 is different from the solid-state imaging device 11 shown in FIG. 2 in that the solid-state imaging device 11A is configured to include a photoelectric conversion film 35' and an opposite electrode 36'. To put it in detail, in the solid-state imaging device 11 shown in FIG. 2, as explained before, a photoelectric conversion film 35 and an opposite electrode 36 which are provided for each of pixels 12 on any specific pixel row are separated from respectively a photoelectric conversion film 35 and an opposite electrode 36 which are provided for each of corresponding pixels 12 on a pixel row other than the specific pixel row. On the other hand, the solid-state imaging device 11A shown in FIG. 8 is configured to employ the photoelectric conversion films 35' provided in an entire contiguous area occupied by pixels 12 including the photoelectric conversion films 35' and employ the opposite electrodes 36' in an entire contiguous area occupied by pixels 12 including the opposite electrodes 36'. In other words, the solid-state imaging device 11A shown in FIG. 8 is configured to include the photoelectric conversion films 35' and the opposite electrodes 36' not for every row of pixels 12. That is to say, a photoelectric conversion film 35' and an opposite electrode 36' which are provided for a row of pixels 12 are not separated away from respectively a photoelectric conversion film 35' and an opposite electrode 36' which are provided for any other row of pixels 12.

In the solid-state imaging device 11A having such a configuration, the opposite electrode 36' is provided on a row of pixels 12 not independently of other pixel rows. That is to say, opposite electrodes 36' provided for a pixel row are in a state of being electrically connected to opposite electrodes 36' each provided for another pixel row throughout the entire contiguous area cited above so that electric potentials appearing at the opposite electrodes 36' are uniform for all pixels 12.

Figure 9:
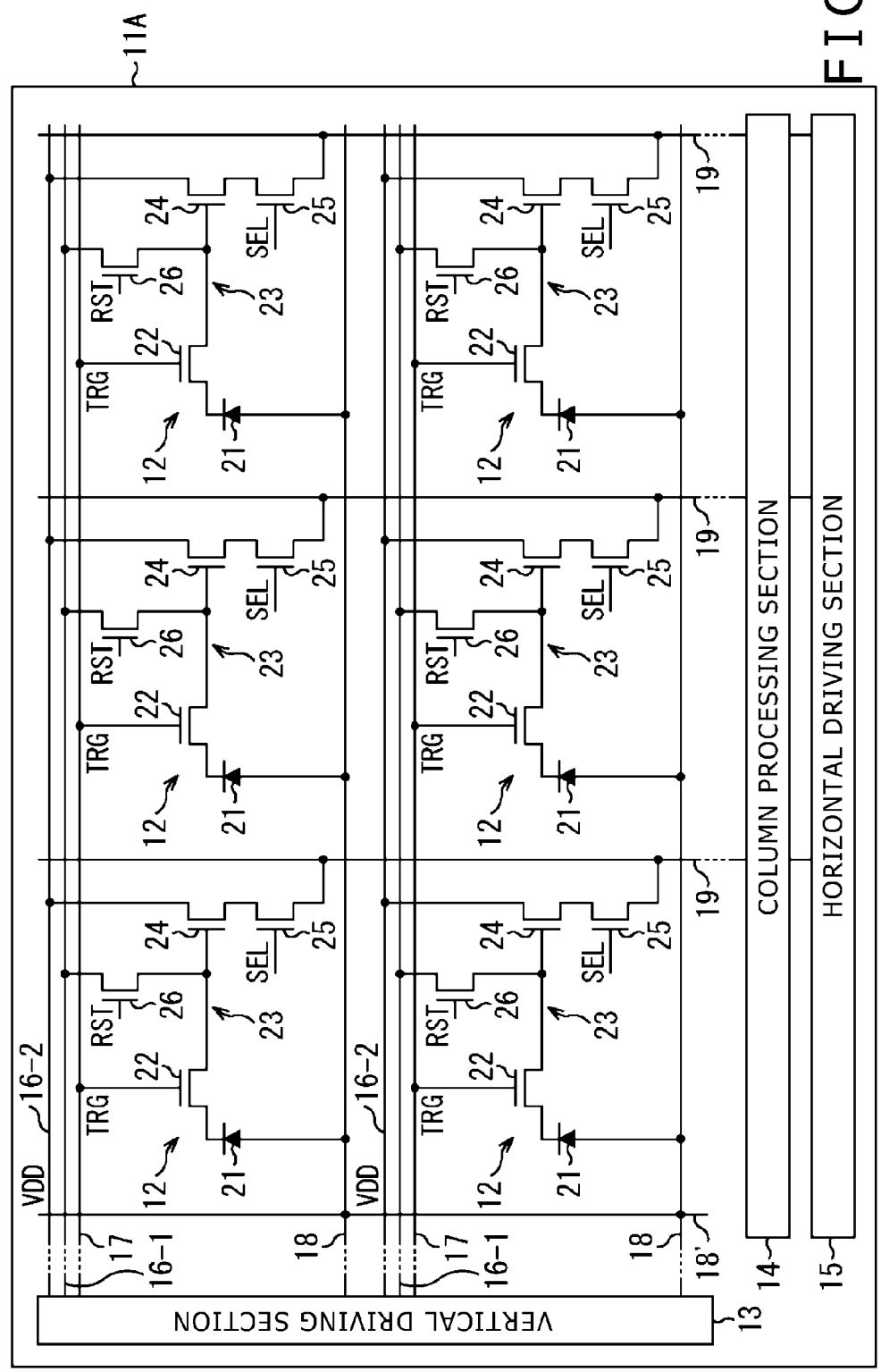
FIG. 9 is a circuit diagram showing a typical configuration of the solid-state imaging device according to the second embodiment.

FIG. 9 is a circuit diagram showing a typical configuration of the solid-state imaging device 11A according to the second embodiment of the present disclosure.

The solid-state imaging device 11A shown in FIG. 9 is different from the solid-state imaging device 11 shown in FIG. 1 in that, in the case of the solid-state imaging device 11A, facing-electrode power supply lines 18 each provided for a row of pixels 12 are electrically connected to each other by a facing-electrode power supply line 18'. In addition, a power-supply system provided for the reset transistor 26 is separated away from a power-supply system provided for the amplification transistor 24. To put it concretely, a power-supply line 16-1 is provided for the reset transistor 26 whereas a power-supply line 16-2 is provided for the amplification transistor 24. On top of that, as will be described later by referring to FIG. 10, a power-supply voltage VDD supplied to the reset transistor 26 becomes a negative electric potential with a predetermined timing. In addition, a constant power-supply voltage VDD such as typically a voltage of 2.7 V is supplied to the amplification transistor 24. It is to be noted that the rest of the configuration of the solid-state imaging device 11A is identical with that of the solid-state imaging device 11.

In the solid-state imaging device 11A having such a configuration, unlike the method explained before by referring to FIG. 4 for example, it is difficult to provide a row of pixels 12 with an electric potential different from electric potentials each supplied to another row of pixels 12. That is to say, the solid-state imaging device 11A is driven by adoption of a driving method different from the driving method for the solid-state imaging device 11.

Figure 10:
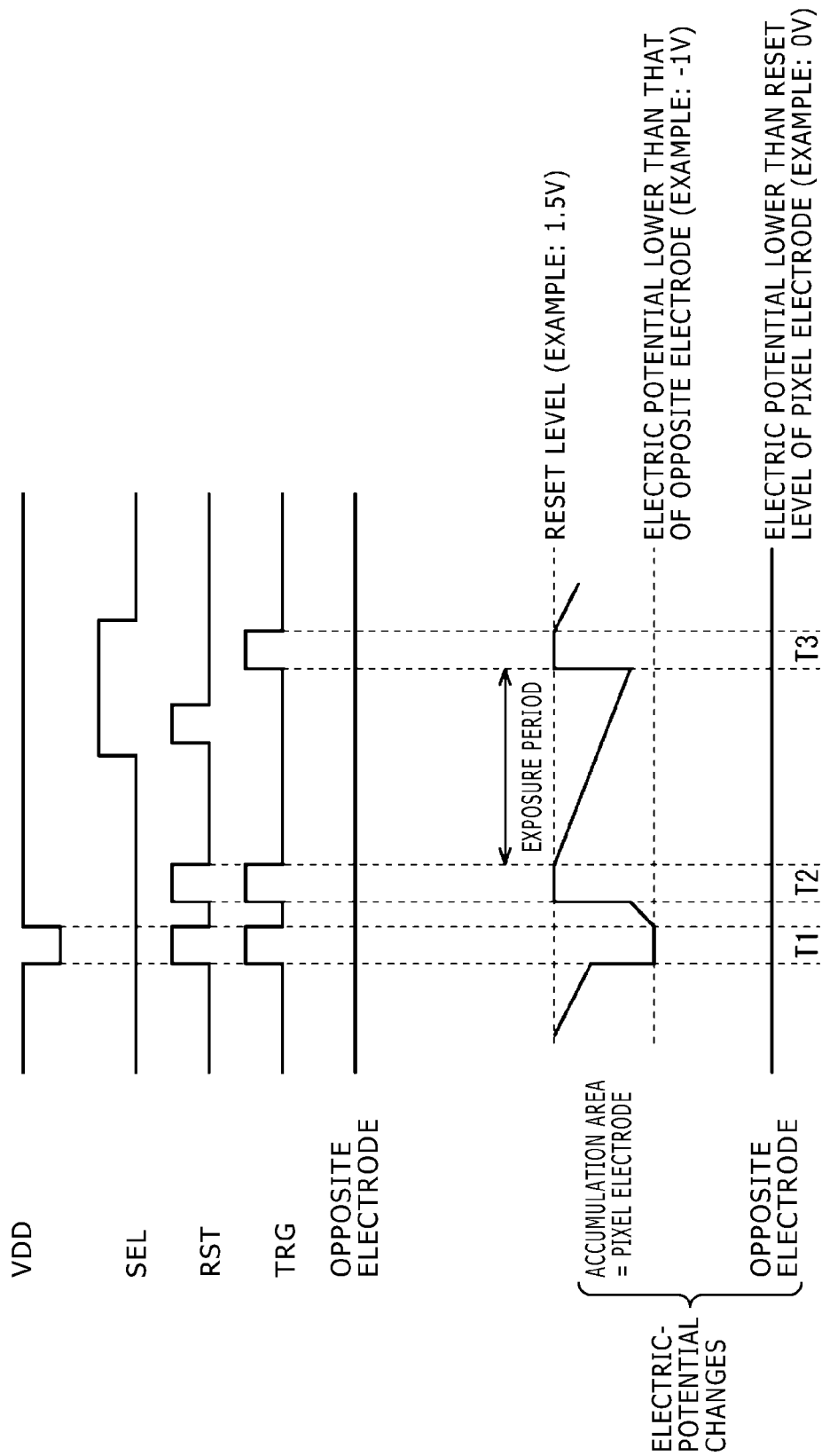
FIG. 10 is an explanatory diagram to be referred to in description of a method for driving the solid-state imaging device according to the second embodiment.

FIG. 10 is an explanatory diagram referred to in the following description of a method for driving the pixel 12 employed in the solid-state imaging device 11A according to the second embodiment of the present disclosure.

FIG. 10 shows driving timings of the pixel 12 employed in the solid-state imaging device 11A as well as electric-potential changes of the pixel electrode 34 and the opposite electrode 36' which sandwich the photoelectric conversion film 35'.

As shown in FIG. 10, an electric potential appearing at the opposite electrode 36' in the solid-state imaging device 11A is also sustained at a fixed level such as 0 V all the time.

First of all, with a timing T1, the vertical driving section 13 puts the transfer signal TRG and the reset signal RST in an ON state and, in addition, sets the power-supply voltage VDD supplied to the pixel 12 through a power supply line 16-1 at an electric potential lower than an electric potential appearing at the opposite electrode 36'. For example, the vertical driving section 13 sustains the power-supply voltage VDD at +2.7 V at normal times but, with the timing T1 only, sets the power-supply voltage VDD at −1.0 V.

Since the reset transistor 26 and the transfer transistor 22 are put in an ON state with the timing T1 as described above, through the FD 23, the electric-charge accumulation area 32 is connected to the power-supply voltage VDD set at an electric potential lower than an electric potential appearing at the opposite electrode 36'. In addition, since an electric potential appearing at the pixel electrode 34 has the same level as an electric potential appearing at the electric-charge accumulation area 32, the electric potential appearing at the pixel electrode 34 is lower than the electric potential appearing at the opposite electrode 36'. Thus, the direction of a bias applied to the photoelectric conversion film 35' is a direction of extracting electrons to the opposite electrode 36'.

It is to be noted that, at that time, electrons are injected into the electric-charge accumulation area 32 of the silicon substrate 31 through the power supply line 16-1 so that the electrons are accumulated in the electric-charge accumulation area 32.

Then, with a timing T2 after the end of the timing T1, the vertical driving section 13 again puts the transfer signal TRG and the reset signal RST in an ON state. At that time, the power-supply voltage VDD is set at an electric potential higher than the electric potential appearing at the opposite electrode 36' so that electrons injected into the electric-charge accumulation area 32 with the timing T1 are exhausted to the power-supply voltage VDD through the reset transistor 26, the FD 23 and the transfer transistor 22. That is to say, electric charge accumulated in the electric-charge accumulation area 32 is reset.

Later on, at the end of the timing T2, the exposure period is started. In the exposure period, electric charge generated by the photoelectric conversion film 35 is accumulated in the electric-charge accumulation area 32. As electric charge generated by the photoelectric conversion film 35 is accumulated in the electric-charge accumulation area 32, the electric potential appearing at the electric-charge accumulation area 32 decreases. In addition, the vertical driving section 13 puts the select signal SEL in an ON state and, with the select signal SEL put in the ON state, the vertical driving section 13 puts the reset signal RST in an ON state in order to read out an electric potential appearing at the FD 23 put in a reset state.

Then, with a timing T3, the vertical driving section 13 puts the transfer signal TRG in an ON state in order to terminate the exposure period. When the exposure period is terminated, electric charge accumulated in the electric-charge accumulation area 32 is transferred to the FD 23 so that the electric potential appearing at the electric-charge accumulation area 32 and, thus, the electric potential appearing at the pixel electrode 34 are again brought to the reset level.

With the subsequent timing T1, processing is carried out by the vertical driving section 13 in the same way for the next frame to put the transfer signal TRG and the reset signal RST in an ON state and, in addition, to set the power-supply voltage VDD supplied to the pixel 12 through the power supply line 16-1 at an electric potential lower than an electric potential appearing at the opposite electrode 36'.

In the solid-state imaging device 11A described above, with a predetermined timing outside the exposure period, a bias is applied to the photoelectric conversion film 35' in a direction opposite to the direction of a voltage applied to the photoelectric conversion film 35' during the exposure period. In the case of the typical example shown in FIG. 10, the predetermined timing outside the exposure period is the timing T1 immediately preceding the timing T2 with which the electric-charge accumulation area 32 is reset. Since a bias is applied to the photoelectric conversion film 35' with a predetermined timing outside the exposure period in a direction opposite to the direction of a voltage applied to the photoelectric conversion film 35' during the exposure period in this way, it is possible to get rid of electric-charge traps generated in the photoelectric conversion film 35' by the voltage applied to the photoelectric conversion film 35' during the preceding exposure period. As a result, the photoelectric conversion film 35' can be prevented from deteriorating due to accumulation of such electric-charge traps.

Figure 11:
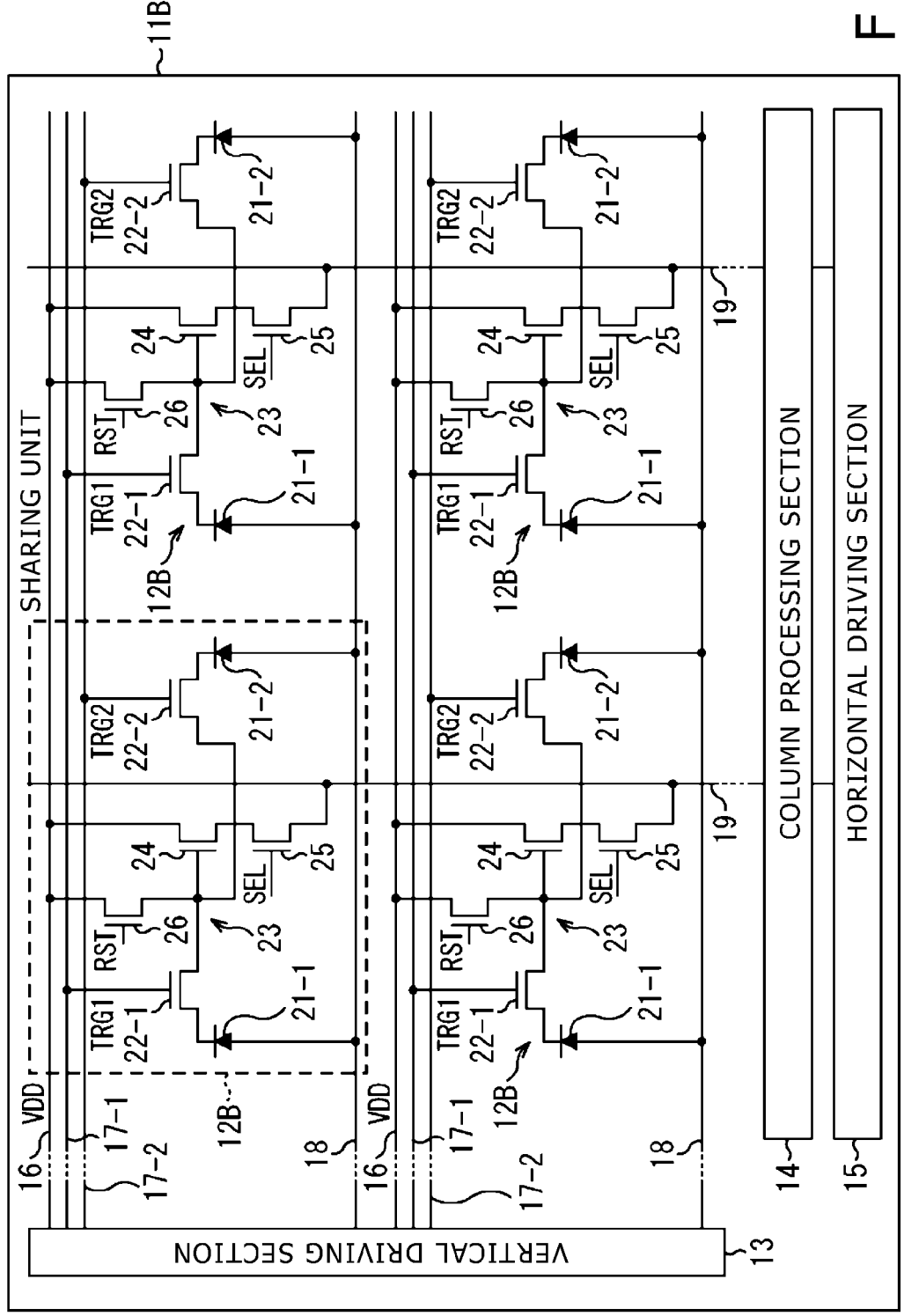
FIG. 11 is a circuit diagram showing a typical configuration of a solid-state imaging device according to a third embodiment of the present disclosure.

FIG. 11 is a circuit diagram showing a typical configuration of a solid-state imaging device 11B according to a third embodiment of the present disclosure.

As shown in FIG. 11, one pixel 12B in the solid-state imaging device 11B is configured to serve as a sharing unit including a photoelectric conversion section 21-1, a photoelectric conversion section 21-2, a transfer transistor 22-1, a transfer transistor 22-2, an FD 23, an amplification transistor 24, a select transistor 25 and a reset transistor 26. The photoelectrical conversion sections 21-1 and 21-2 each include as a photoelectric conversion film 35 whereas the transfer transistor 22-1 and the transfer transistor 22-2 each function as a transfer transistor 22. On the other hand, the FD 23, the amplification transistor 24, the select transistor 25 and the reset transistor 26 are each a shared component common to both sides of the pixel 12B.

It is to be noted that, in the same way as the solid-state imaging device 11 shown in FIG. 2, an opposite electrode 36 is formed for each of pixels 12 in such a way that the opposite electrodes 36 each formed for one of the pixels 12 at least having different read timings are separated away from each other. That is to say, as shown in FIG. 2, an opposite electrode 36 formed for any specific row of pixels 12 is separated away from an opposite electrode 36 formed for any other row of pixels 12. Thus, in the pixel 12B, a plurality of photoelectric conversion sections 21 laid out in the direction of a pixel row having the same read timing and a plurality of transfer transistors 22 also laid out in the direction of the pixel row can share the common components described above. In the pixel 12B shown in FIG. 11, the photoelectric conversion sections 21 laid out in the direction of a pixel row are the photoelectric conversion section 21-1 and the photoelectric conversion section 21-2 whereas the transfer transistors 22 also laid out in the direction of a pixel row are the transfer transistor 22-1 and the transfer transistor 22-2. On the other hand, the shared common components are the FD 23, the amplification transistor 24, the select transistor 25 and the reset transistor 26.

In addition, the pixel 12B is configured to include an electric-charge accumulation area 32 for every pair of photoelectric conversion sections 21-1 and 21-2. On top of that, in the same way as the pixel 12' shown in FIG. 5, the pixel 12B is configured to include also a contact area 51 and an electric-potential barrier section 52 for every pair of photoelectric conversion sections 21-1 and 21-2.

Figure 12:
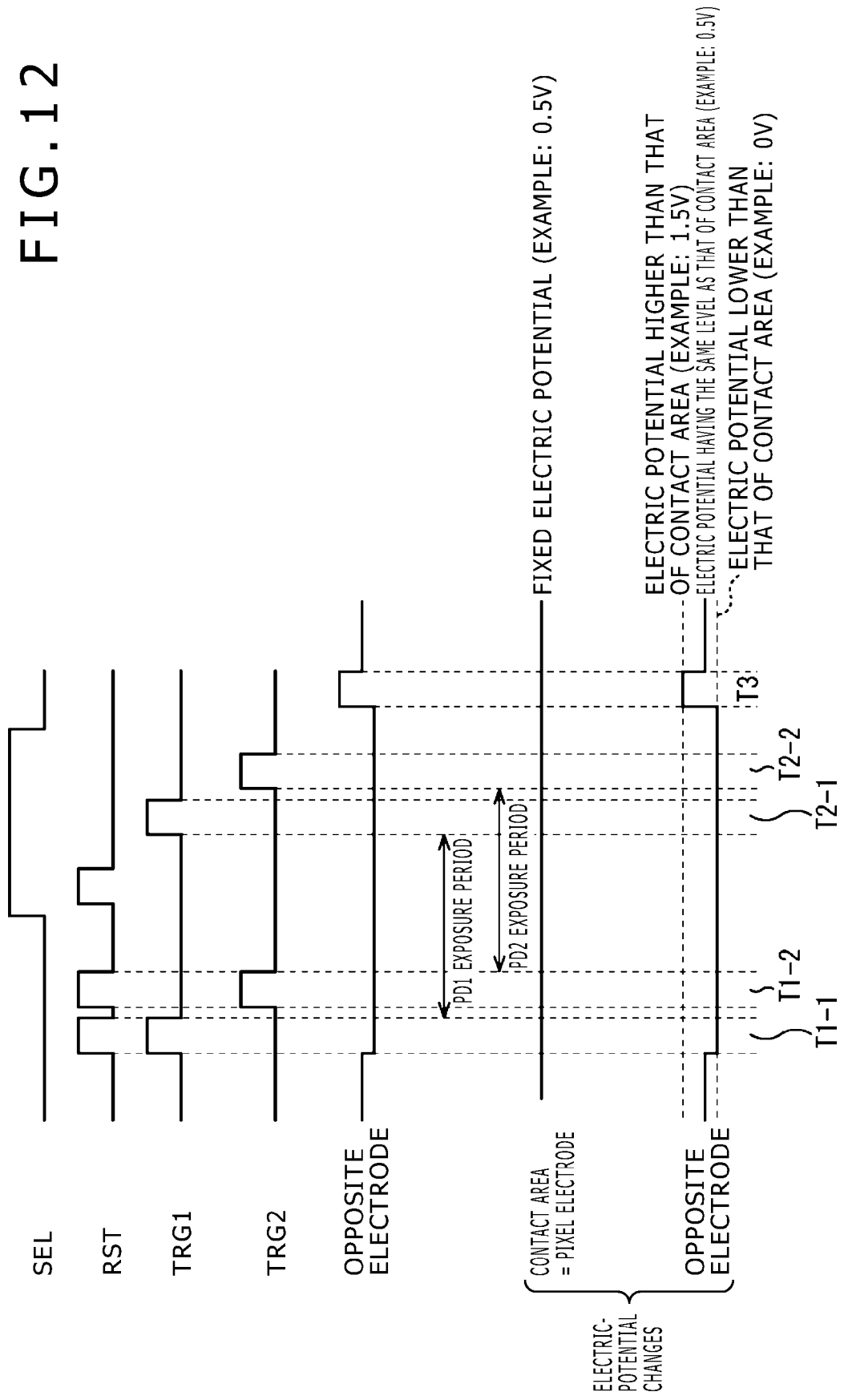
FIG. 12 is an explanatory diagram to be referred to in description of a method for driving the solid-state imaging device according to the third embodiment.

Next, a driving method for driving the pixel 12B is explained by referring to FIG. 12 as follows.

First of all, in the solid-state imaging device 11B, before the start of the exposure period of the pixel 12B and after the end of the timing T3, an electric potential having the same level as that appearing in the contact area 51 is applied to the opposite electrode 36. For example, before the start of the exposure period and after the end of the timing T3, an electric potential of typically 0.5 V is applied to the opposite electrode 36.

Then, with a timing T1-1, the vertical driving section 13 puts a transfer signal TRG1 and the reset signal RST in an ON state in order to reset the electric-charge accumulation area 32 of the photoelectric conversion section 21-1 through the FD 23. Since an electric-potential barrier formed by the electric-potential barrier section 52 exists at a position between the electric-charge accumulation area 32 of the photoelectric conversion section 21-1 and the contact area 51, the electric potential appearing at the contact area 51 is sustained at a constant level at that time. Subsequently, as the transfer signal TRG1 and the reset signal RST are put in an OFF state at the end of the timing T1-1, the exposure period of the photoelectric conversion section 21-1 is started.

Then, with a timing T1-2, the vertical driving section 13 puts a transfer signal TRG2 and the reset signal RST in an ON state in order to reset the electric-charge accumulation area 32 of the photoelectric conversion section 21-2 through the FD 23. Since an electric-potential barrier formed by the electric-potential barrier section 52 exists at a position between the electric-charge accumulation area 32 of the photoelectric conversion section 21-2 and the contact area 51, the electric potential appearing at the contact area 51 is sustained at a constant level at that time. Subsequently, as the transfer signal TRG2 and the reset signal RST are put in an OFF state at the end of the timing T1-2, the exposure period of the photoelectric conversion section 21-2 is started.

Later on, with a timing T2-1, the vertical driving section 13 puts the transfer signal TRG1 in an ON state in order to terminate the exposure period of the photoelectric conversion section 21-1 and transfer electric charge accumulated in the electric-charge accumulation area 32 of the photoelectric conversion section 21-1 to the FD 23. In addition, with a timing T2-2, the vertical driving section 13 puts the transfer signal TRG2 in an ON state in order to terminate the exposure period of the photoelectric conversion section 21-2 and transfer electric charge accumulated in the electric-charge accumulation area 32 of the photoelectric conversion section 21-2 to the FD 23.

Then, with a timing T3 right after the end of the timing T2-2, the vertical driving section 13 applies an electric potential higher than an electric potential at the contact area 51 to the opposite electrode 36 through the facing-electrode power-supply line 18. For example, the vertical driving section 13 applies an electric potential of 1.5 V to the opposite electrode 36 through the facing-electrode power-supply line 18. Thus, in the pixel 12B, an electric potential is applied to the photoelectric conversion film 35 of the photoelectric conversion section 21-1 and the photoelectric conversion film 35 of the photoelectric conversion section 21-2 in a direction opposite to the direction of a voltage applied to the photoelectric conversion films 35 during the exposure period. As a result, it is possible to get rid of electric-charge traps generated in the photoelectric conversion film 35 of the photoelectric conversion section 21-1 and the photoelectric conversion film 35 of the photoelectric conversion section 21-2 by the voltage applied to the photoelectric conversion films 35 during the exposure period. That is to say, it is possible to prevent electric-charge traps from being accumulated in the photoelectric conversion film 35 of the photoelectric conversion section 21-1 and the photoelectric conversion film 35 of the photoelectric conversion section 21-2. Accordingly, it is possible to prevent the photoelectric conversion films 35 from deteriorating due to electric-charge traps accumulated in the photoelectric conversion films 35.

As described above, the pixel 12B including the 2 photoelectric conversion sections 21-1 and 21-2 is also capable of preventing the photoelectric conversion film 35 of the photoelectric conversion section 21-1 and the photoelectric conversion film 35 of the photoelectric conversion section 21-2 from deteriorating, repressing characteristic variations of the photoelectric conversion films 35 and hence improving the reliability of the photoelectric conversion films 35.

The solid-state imaging devices like the ones described above can be applied to a variety of electronic equipments such as an imaging system, a hand phone having an imaging function and other electronic apparatus each having an imaging function. Typical examples of the imaging system are a digital still camera and a digital video camera.

Figure 13:
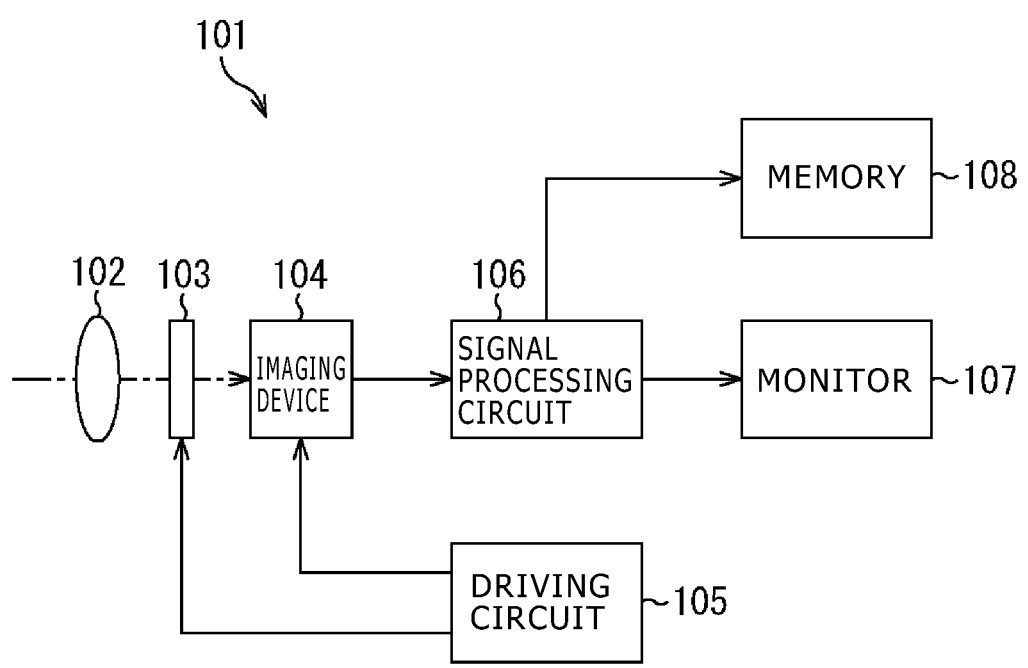
FIG. 13 is a block diagram showing a typical configuration of an imaging apparatus mounted on an electronic equipment.

FIG. 13 is a block diagram showing a typical configuration of an imaging apparatus 101 mounted on an electronic equipment.

As shown in FIG. 13, the imaging apparatus 101 is configured to include an optical system 102, a shutter section 103, an image taking device 104, a driving circuit 105, a signal processing circuit 106, a monitor 107 and a memory 108 which make the imaging apparatus 101 capable of imaging a still picture and a moving picture.

The optical system 102 is configured to include a lens or a plurality of lenses. The optical system 102 directs image light incident thereto from an imaging object to the image taking device 104 by way of the shutter section 103. Receiving the image light, the image taking device 104 forms an image of the imaging object on the light receiving surface of the image taking device 104. The light receiving surface of the image taking device 104 is also referred to as a sensor section.

Placed at a location between the optical system 102 and the image taking device 104, the shutter section 103 controls the period during which the image light is radiated from the optical system 102 to the image taking device 104 and the period during which the propagation of the image light from the optical system 102 to the image taking device 104 is blocked in accordance with control executed by the driving circuit 105.

The image taking device 104 is typically a solid-state imaging device according to any one of the embodiments and the modified version which have been explained before. The image taking device 104 accumulates signal electric charge during a predetermined period of time in accordance with an image formed on the light receiving surface on the basis of the image light propagating from the optical system 102 to the image taking device 104 by way of the shutter section 103. Then, the image taking device 104 transfers the accumulated signal electric charge to the signal processing circuit 106 in accordance with a driving signal (or a timing signal) received by the image taking device 104 from the driving circuit 105.

The driving circuit 105 outputs driving signals to the image taking device 104 and the shutter section 103. The driving signals are used for controlling an operation carried out by the image taking device 104 to transfer electric charge to the signal processing circuit 106 and a shutter operation carried out by the shutter section 103.

The signal processing circuit 106 carries out various kinds of signal processing on the signal electric charge received from the image taking device 104. The signal processing circuit 106 supplies image data obtained as a result of the signal processing carried out by the signal processing circuit 106 to the monitor 107 which then displays an image based on the image data. The signal processing circuit 106 also supplies the image data to the memory 108 used for storing (or recording) the data.

In the imaging apparatus 101 having the configuration described above, the image taking device 104 is the solid-state imaging device including a photoelectric conversion film like the one explained before. Thus, the reliability of the image taking device 104 can be improved.

It is to be noted that, by applying the present disclosure to an imaging apparatus having a configuration in which light is radiated to the solid-state imaging device 11 employed in the imaging apparatus also during a period other than the exposure period, a more effective effect can be obtained. In particular, the present disclosure is very beneficial for a laminated image sensor as described above.

In addition, in a solid-state imaging device provided for a rolling shutter as is the case with the CIS (CMOS Image Sensor), every pixel in the pixel area is typically in an exposure state, making it difficult to apply a bias to the pixel with a timing outside the exposure period in a direction opposite to the direction of a voltage applied to the pixel during the exposure period. By applying the present disclosure to a solid-state imaging device, however, it is possible to apply a bias to the photoelectric conversion film 35 with a timing outside the exposure period in a direction opposite to the direction of a voltage applied to the photoelectric conversion film 35 during the exposure period even if the solid-state imaging device is a CMOS image sensor provided for rolling-shutter operations. Thus, electric-charge tramps can be exhausted from the photoelectric conversion film 35. On top of that, even in the case of an imaging apparatus having a configuration in which the solid-state imaging device 11 employed in the imaging apparatus is shielded against incident light by making use of a mechanical shutter during periods other than the exposure period, electric-charge traps may probably be accumulated in the photoelectric conversion film 35 due to a dark current or the like. By applying the present disclosure to the imaging apparatus having such a configuration, however, the effect described above can be obtained.

In addition, the pixel 12 has a configuration employing four transistors as shown in FIG. 1. However, a pixel can also be configured to include three transistors excluding the select transistor 25.

It is to be noted that the present disclosure is properly applied to a laminated CMOS image sensor in which carriers generated in the photoelectric conversion film 35 employed in the photoelectric conversion section 21 formed on the silicon substrate 31 are accumulated in the electric-charge accumulation area 32 inside the silicon substrate 31 through the connection section 33 and then read out from the electric-charge accumulation area 32. In addition, materials each used for making the photoelectric conversion film 35 are by no means limited to the amorphous semiconductor, the poly-crystal semiconductor (or a compound semiconductor) or the organic film which are cited before.

On top of that, the solid-state imaging device 11 according to the present disclosure can have the configuration of a CMOS solid-state imaging device of the back-surface radiation type, a CMOS solid-state imaging device of the front-surface radiation type or a CCD solid-state imaging device. In addition, the present disclosure can also be applied to another solid-state imaging device without regard to the structure of the device. For example, the present disclosure can also be applied to typically a CMOS image sensor of the longitudinal-direction polarization type. Such a CMOS image sensor includes a photoelectric conversion area in which the wavelength of absorbed light varies along the depth direction of the silicon substrate 31.

It is to be noted that the scope of the present disclosure includes the following implementations:

1: An imaging device including:
  a plurality of pixels disposed to form a matrix having pixel rows, the pixels including:
    a pixel electrode formed on a silicon substrate for one of the pixels by being separated away from another pixel electrodes formed for one of the other pixels,
    a photoelectric conversion film formed on the pixel electrode, and
    an opposite electrode formed on the photoelectric conversion film; and
  a driving section configured to apply an electric potential to the photoelectric conversion film on each of the pixel rows at least having read timings different from each other with a predetermined timing outside an exposure period of the pixels in a direction opposite to that of an electric potential applied to the photoelectric conversion film during the exposure period of the pixels.

2: The imaging device according to implementation 1 wherein, for each of the pixel rows at least having read timings different from each other, the opposite electrode is formed to be separated away from the other opposite electrodes each adjacent to the individual opposite electrode.

3: The imaging device according to implementation 2 wherein, with a predetermined timing outside the exposure period of the pixels, the driving section sets an electric potential applied to the opposite electrode at a level higher than the electric potential of a reset level of the pixel electrode.

4: The imaging device according to any one of implementations 1 to 3 wherein the pixels further include:
  an electric-charge accumulation area for accumulating electric charge obtained from the photoelectric conversion film;
  a contact area connected to the pixel electrode; and
  an electric-potential barrier section provided between the electric-charge accumulation area and the contact area to form an electric-potential barrier having a predetermined electric potential.

5: The imaging device according to any one of implementations 1 to 4 wherein, at least in a period between the start of the exposure period of the pixel and the end of the predetermined timing, the driving section applies a voltage to the opposite electrode, the voltage having an electric potential approximately equal to an electric potential at the pixel electrode.

6: The imaging device according to any one of implementations 1 to 5 wherein the pixels share a plurality of the photoelectric conversion films in the direction of the pixel rows.

7: The imaging device according to implementation 1 wherein, through a power-supply line provided for each of the pixel rows each including the pixels having the same read timing, the driving section sets a power-supply voltage supplied to each of the pixels at an electric potential lower than an electric potential at the opposite electrode with a predetermined timing outside the exposure period of the pixels.

It is to be noted that implementations of the present disclosure are by no means limited to the embodiments and the modified version which are described above. That is to say, a variety of other changes and other modifications can be made to the embodiments as long as the other changes and the other modifications fall within ranges not deviating from essentials of the present disclosure.

The present disclosure contains subject matter related to that disclosed in Japanese Priority Patent Application JP 2011-135721 filed in the Japan Patent Office on Jun. 17, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. An imaging device comprising:
   a plurality of pixels disposed to form a matrix having pixel rows, the pixels including
      a pixel electrode formed on a silicon substrate for one of said pixels by being separated away from another pixel electrodes formed for one of the other pixels,
      a photoelectric conversion film formed on said pixel electrode, and
      an opposite electrode formed on said photoelectric conversion film; and
   a driving section configured to apply an electric potential to said photoelectric conversion film on each of said pixel rows at least having read timings different from each other with a predetermined timing outside an exposure period of said pixels in a direction opposite to that of an electric potential applied to said photoelectric conversion film during said exposure period of said pixels.

2. The imaging device according to claim 1 wherein, for each of said pixel rows at least having read timings different from each other, said opposite electrode is formed to be separated away from the other opposite electrodes each adjacent to said opposite electrode.

3. The imaging device according to claim 2 wherein, with a predetermined timing outside said exposure period of said pixels, said driving section sets an electric potential applied to said opposite electrode at a level higher than the electric potential of a reset level of said pixel electrode.

4. The imaging device according to claim 3 wherein said pixels further comprise:
   an electric-charge accumulation area for accumulating electric charge obtained from said photoelectric conversion film;
   a contact area connected to said pixel electrode; and
   an electric-potential barrier section provided between said electric-charge accumulation area and said contact area to form an electric-potential barrier having a predetermined electric potential.

5. The imaging device according to claim 4 wherein, at least in a period between the start of said exposure period of said pixel and the end of said predetermined timing, said driving section applies a voltage to said opposite electrode, the voltage having an electric potential approximately equal to an electric potential at said pixel electrode.

6. The imaging device according claim 1 wherein said pixels share a plurality of said photoelectric conversion films in the direction of said pixel rows.

7. The imaging device according to claim 1 wherein, through a power-supply line provided for each of said pixel rows each including said pixels having the same read timing, said driving section sets a power-supply voltage supplied to each of said pixels at an electric potential lower than an electric potential at said opposite electrode with a predetermined timing outside said exposure period of said pixels.

8. A driving method for driving an imaging device including a plurality of pixels disposed to form a matrix having pixel rows, the pixels including
   a pixel electrode formed on a silicon substrate for one of said pixels by being separated away from another pixel electrodes formed for one of the other pixels;
   a photoelectric conversion film formed on said pixel electrode; and
   an opposite electrode formed on said photoelectric conversion film,
   said driving method comprising applying an electric potential to said photoelectric conversion film on each of said pixel rows at least having read timings different from each other with a predetermined timing outside an exposure period of said pixels in a direction opposite to that of an electric potential applied to said photoelectric conversion film during said exposure period of said pixels.

9. An electronic apparatus employing an imaging device comprising:
   a plurality of pixels disposed to form a matrix having pixel rows, the pixels including
      a pixel electrode formed on a silicon substrate for one of said pixels by being separated away from another pixel electrodes formed for one of the other pixels,
      a photoelectric conversion film formed on said pixel electrode, and
      an opposite electrode formed on said photoelectric conversion film; and
   a driving section configured to apply an electric potential to said photoelectric conversion film on each of said pixel rows at least having read timings different from each other with a predetermined timing outside an exposure period of said pixels in a direction opposite to that of an electric potential applied to said photoelectric conversion film during said exposure period of said pixels.

* * * * *